United States Patent
Minegishi et al.

(10) Patent No.: US 9,170,493 B2
(45) Date of Patent: Oct. 27, 2015

(54) RESIST UNDERLAYER FILM-FORMING COMPOSITION, PATTERN-FORMING METHOD AND RESIST UNDERLAYER FILM

(71) Applicant: JSR CORPORATION, Tokyo (JP)

(72) Inventors: Shin-ya Minegishi, Tokyo (JP); Kazuhiko Komura, Tokyo (JP); Shin-ya Nakafuji, Tokyo (JP); Takanori Nakano, Tokyo (JP)

(73) Assignee: JSR CORPORATION, Tokyo (JP)

( * ) Notice: Subject to any disclaimer, the term of this patent is extended or adjusted under 35 U.S.C. 154(b) by 32 days.

(21) Appl. No.: 14/011,781

(22) Filed: Aug. 28, 2013

(65) Prior Publication Data

US 2013/0341304 A1    Dec. 26, 2013

Related U.S. Application Data

(63) Continuation of application No. PCT/JP2012/054471, filed on Feb. 23, 2012.

(30) Foreign Application Priority Data

Feb. 28, 2011 (JP) ................................. 2011-043311

(51) Int. Cl.
*G03F 7/40* (2006.01)
*G03F 7/11* (2006.01)
*H01L 21/027* (2006.01)
*G03F 7/09* (2006.01)
*C08F 220/18* (2006.01)
*C08L 61/06* (2006.01)
*C08L 61/12* (2006.01)
*G03F 7/34* (2006.01)
*H01L 21/311* (2006.01)

(52) U.S. Cl.
CPC ............... *G03F 7/09* (2013.01); *C08F 220/18* (2013.01); *C08L 61/06* (2013.01); *C08L 61/12* (2013.01); *G03F 7/094* (2013.01); *G03F 7/34* (2013.01); *H01L 21/0271* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 5,266,440 A | * | 11/1993 | Zampini | 430/192 |
| 5,723,264 A | * | 3/1998 | Robello et al. | 430/321 |
| 5,858,547 A | * | 1/1999 | Drage | 428/451 |
| 6,316,165 B1 | | 11/2001 | Pavelchek et al. | |
| 6,517,951 B2 | * | 2/2003 | Hacker et al. | 428/524 |
| 2002/0110665 A1 | * | 8/2002 | Rutter et al. | 428/137 |
| 2006/0014106 A1 | * | 1/2006 | Hatakeyama et al. | 430/311 |
| 2008/0206676 A1 | | 8/2008 | De et al. | |
| 2010/0028802 A1 | | 2/2010 | Konno et al. | |
| 2014/0220783 A1 | * | 8/2014 | Koumura et al. | 438/703 |

FOREIGN PATENT DOCUMENTS

| | | |
|---|---|---|
| JP | 07-183194 A | 7/1995 |
| JP | 2000-294504 | 10/2000 |
| JP | 2001-284209 | 10/2001 |
| JP | 2003-119253 | 4/2003 |
| JP | 2009-020456 A | 1/2009 |
| JP | 2009-251130 | 10/2009 |
| JP | 2010-026221 | 2/2010 |
| JP | 2010-520930 | 6/2010 |
| TW | 1253544 B | 4/2006 |
| TW | 200900862 A | 1/2009 |
| TW | 201009503 A | 3/2010 |
| WO | WO 2008/038544 | 4/2008 |
| WO | WO-2013/054702 A1 * | 4/2013 |

OTHER PUBLICATIONS

English translation of JP 2010-026221, A (2010) from machine translation from AIPN Japan Patent Office National Center for Industrial Property Information and Training, generated Oct. 24, 2014, 39 pages.*
International Search Report for corresponding International Application No. PCT/JP2012/054471, Mar. 27, 2012.
Office Action issued Sep. 30, 2014 in Japanese Patent Application No. 2013-502277 (with English language translation).
Office Action issued May 19, 2015, in Japanese Patent Application No. 2013-502277 (w/ English translation).
Office Action issued Jun. 12, 2015, in Taiwan Patent Application No. 101106259 (w/ English translation).

* cited by examiner

*Primary Examiner* — Cynthia Hamilton
(74) *Attorney, Agent, or Firm* — Oblon, McClelland, Maier & Neustadt, L.L.P.

(57) ABSTRACT

A resist underlayer film-forming composition includes a polymer having a glass transition temperature (Tg) of 0 to 180° C. The resist underlayer film-forming composition is used for a multilayer resist process. The multilayer resist process includes forming a silicon-based oxide film on a surface of a resist underlayer film, and subjecting the silicon-based oxide film to wet etching.

16 Claims, No Drawings

RESIST UNDERLAYER FILM-FORMING COMPOSITION, PATTERN-FORMING METHOD AND RESIST UNDERLAYER FILM

CROSS-REFERENCE TO RELATED APPLICATIONS

The present application is a continuation application of International Application No. PCT/JP2012/054471, filed Feb. 23, 2012, which claims priority to Japanese Patent Application No. 2011-043311, filed Feb. 28, 2011. The contents of these applications are incorporated herein by reference in their entirety.

BACKGROUND OF THE INVENTION

1. Field of the Invention

The invention relates to a resist underlayer film-forming composition, a pattern-forming method, and a resist underlayer film.

2. Discussion of the Background

A reduction in processing size has progressed by utilizing a multilayer resist process in order to increase the degree of integration of semiconductor devices and the like (see Japanese Patent Application Publication (KOKAI) No. 2001-284209). The multilayer resist process includes applying a resist underlayer film-forming composition to a substrate to form a resist underlayer film, applying a resist composition to the resist underlayer film to form a resist film, transferring a mask pattern through exposure, and developing the resist film using a developer to form a resist pattern. The resist pattern is then transferred to the resist underlayer film by dry etching, the pattern of the resist underlayer film is transferred to the substrate by dry etching to obtain a substrate on which the desired pattern is formed.

In recent years, a further improvement in pattern-forming capability has been desired for the resist underlayer film-forming composition along with a reduction in size of the resist pattern and a reduction in thickness of the resist film. When using a known resist underlayer film-forming composition for the multilayer resist process, the resist underlayer film may be removed from the substrate after forming the resist film probably because the glass transition temperature (Tg) of the resist underlayer film-forming composition is higher than the heating temperature employed when forming the resist film. When wet etching is performed after forming the resist film, the pattern of the resist underlayer film may collapse due to external stimulation caused by wet etching.

SUMMARY OF THE INVENTION

According to one aspect of the present invention, a resist underlayer film-forming composition includes a polymer having a glass transition temperature (Tg) of 0 to 180° C. The resist underlayer film-forming composition is used for a multilayer resist process. The multilayer resist process includes forming a silicon-based oxide film on a surface of a resist underlayer film, and subjecting the silicon-based oxide film to wet etching.

According to another aspect of the present invention, a pattern-forming method includes providing a resist underlayer film on a substrate using the resist underlayer film-forming composition. A silicon-based oxide film is provided on a surface of the resist underlayer film. The silicon-based oxide film is subjected to wet etching.

According to further aspect of the present invention, a resist underlayer film is formed using the resist underlayer film-forming composition.

DESCRIPTION OF THE EMBODIMENTS

According to one embodiment of the invention, a resist underlayer film-forming composition is used for a multilayer resist process that includes forming a silicon-based oxide film on a surface of a resist underlayer film, and subjecting the silicon-based oxide film to wet etching, the resist underlayer film-forming composition including [A] a polymer having a Tg of 0 to 180° C. (hereinafter may be referred to as "polymer [A]").

Since the polymer [A] included in the resist underlayer film-forming composition according to the embodiment of the invention has a glass transition temperature (Tg) of 0 to 180° C., a resist underlayer film that is formed using the resist underlayer film-forming composition exhibits excellent adhesion to the substrate, and is rarely removed from the substrate.

Since the resist underlayer film-forming composition exhibits excellent wet etching resistance, it is possible to suppress a situation in which the pattern of the resist underlayer film collapses due to external stimulation caused by etching even when using the multilayer resist process that performs wet etching after forming a resist film. Note that the term "multilayer resist process" used herein refers to a multi-stage process that normally includes forming a resist underlayer film on a substrate, forming a resist pattern on the resist underlayer film, transferring the resist pattern to the resist underlayer film to form an underlayer film pattern, and transferring the resist pattern to the substrate using the underlayer film pattern as an etching mask, for example.

It is preferable that the polymer [A] include a structural unit represented by the following formula (1) (hereinafter may be referred to as "structural unit (I)").

wherein $R^1$ is a hydrogen atom, a fluorine atom, or a methyl group, provided that some or all of the hydrogen atoms of the methyl group are substituted with a substituent, or unsubstituted, E is an oxygen atom, —CO—O—*, or —CO—NH—*, * is a bonding site to which $R^2$ is bonded, and $R^2$ is a monovalent hydrocarbon group, provided that some or all of the hydrogen atoms of the hydrocarbon group are substituted with a substituent, or unsubstituted.

When the polymer [A] includes the structural unit (1), the Tg of the polymer [A] relatively decreases. As a result, a resist underlayer film that is formed using the resist underlayer film-forming composition that includes the polymer [A] exhibits excellent adhesion to the substrate, and also exhibits excellent wet etching resistance.

It is preferable that the polymer [A] include a structural unit represented by the following formula (2) (hereinafter may be referred to as "structural unit (II)").

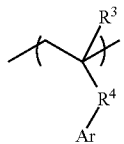
(2)

wherein $R^3$ is a hydrogen atom, a fluorine atom, or a methyl group, provided that some or all of the hydrogen atoms of the methyl group are substituted with a substituent, or unsubstituted, $R^4$ is a single bond or a chain-like hydrocarbon group having 1 to 4 carbon atoms, and Ar is a monovalent aromatic hydrocarbon group, provided that some or all of the hydrogen atoms of the aromatic hydrocarbon group are substituted with a substituent, or unsubstituted.

When the polymer [A] includes the structural unit (II), a resist underlayer film that is formed using the resist underlayer film-forming composition exhibits improved dry etching resistance.

It is preferable that the polymer [A] include a structural unit that includes a —CH$_2$OH group and an aromatic group (hereinafter may be referred to as "structural unit (III)"). When the polymer [A] includes the structural unit (III), the polymer [A] exhibits an improved crosslinking capability.

It is preferable that the polymer [A] include a structural unit represented by the following formula (3) (hereinafter may be referred to as "structural unit (IV)").

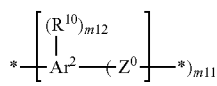
(3)

wherein $Ar^2$ is an aromatic group having a valency of (m11+m12+1), $R^{10}$ is a hydroxyl group, an alkyl group having 1 to 6 carbon atoms, an alkoxy group having 1 to 6 carbon atoms, an alkoxycarbonyl group having 2 to 10 carbon atoms, an aryl group having 6 to 14 carbon atoms, a glycidyl ether group, an alkyl glycidyl ether group wherein an alkyl moiety has 1 to 6 carbon atoms, or —OR (wherein R is a labile functional group), provided that some or all of the hydrogen atoms of the alkyl group, the alkoxy group, the alkoxycarbonyl group, the aryl group, the glycidyl ether group, and the alkyl glycidyl ether group are substituted with a substituent, or unsubstituted, $Z^0$ is a single bond, a methylene group, an alkylene group having 2 to 20 carbon atoms, an arylene group having 6 to 14 carbon atoms, or an alkylene ether group, provided that some or all of the hydrogen atoms of the methylene group, the alkylene group, the arylene group, and the alkylene ether group are substituted with a substituent, or unsubstituted, * is a bonding site, m11 is an integer from 1 to 6 that indicates the number of $Z^0$ bonded to $Ar^2$, and m12 is an integer from 1 to 6 that indicates the number of $R^{10}$ bonded to $Ar^2$, provided that a plurality of $Z^0$ are either identical or different when m11 is an integer from 2 to 6, and a plurality of $R^{10}$ are either identical or different when m12 is an integer from 2 to 6.

When the polymer [A] includes the structural unit (IV), a resist underlayer film that is formed using the resist underlayer film-forming composition exhibits improved dry etching resistance.

According to another embodiment of the invention, a pattern-forming method includes:
(1) forming a resist underlayer film on a substrate using the resist underlayer film-forming composition;
(2) forming a silicon-based oxide film on a surface of the resist underlayer film; and
(3) subjecting the silicon-based oxide film to wet etching.

Since the pattern-forming method utilizes the resist underlayer film-forming composition, the resist underlayer film exhibits excellent adhesion to the substrate, and it is possible to suppress a situation in which the resist underlayer film is removed from the substrate due to wet etching or the like.

It is preferable that the pattern-forming method further include:
(a) applying a resist composition to the silicon-based oxide film to form a resist pattern; and
(b) sequentially subjecting the silicon-based oxide film and the resist underlayer film to dry etching using the resist pattern as a mask,
the step (a) and the step (b) being performed between the step (2) and the step (3).

A fine pattern can be formed when the pattern-forming method includes the above specific steps.

It is preferable that the pattern-forming method further include:
(c) subjecting the substrate to dry etching using the resist underlayer film as a mask after the silicon-based oxide film has been subjected to wet etching,
the step (c) being performed after the step (3).

A finer pattern can be formed when the pattern-forming method include the above specific step.

The pattern-forming method may suitably be used as the multilayer resist process. A finer pattern can be formed by utilizing the pattern-forming method as the multilayer resist process.

According to another embodiment of the invention, a resist underlayer film is formed using the resist underlayer film-forming composition. Since the resist underlayer film is formed using the resist underlayer film-forming composition, the resist underlayer film exhibits excellent adhesion to the substrate.

It is preferable that the resist underlayer film have a static contact angle with water of 70° or more. When the resist underlayer film has a static contact angle with water of 70° or more (i.e., the resist underlayer film exhibits high hydrophobicity), it is possible to reduce external stimulation due to an aqueous solution during wet etching or the like performed after forming the resist film, for example. This makes it possible to further suppress a situation in which the pattern formed by the resist underlayer film collapses.

Note that the term "glass transition temperature (Tg)" used herein refers to a temperature at which a non-crystalline solid material undergoes a glass transition, and refers to a value measured by differential scanning calorimetry (DSC) at a temperature increase rate of 20° C./min.

The term "static contact angle" used herein refers to an angle formed by a stationary liquid droplet that has been dropped onto the resist underlayer film with the surface of the resist underlayer film.

The static contact angle is measured as described below. The resist underlayer film-forming composition is spin-coated onto an 8-inch silicon wafer, heated at 180° C. for 60 seconds on a hot plate (oxygen concentration: 20 vol %), and heated at 350° C. for 60 seconds to form a resist underlayer film having a thickness of 0.3 μm, and the static contact angle (°) formed by the resulting resist underlayer film and water is measured using a contact angle meter ("DLA10L2E" manufactured by KURRS).

The embodiment of the invention thus provide a resist underlayer film that exhibits excellent adhesion to a substrate and excellent wet etching resistance, and may suitably be used for the multilayer resist process that includes removing an intermediate film (e.g., inorganic film) by wet etching, a resist underlayer film-forming composition that may suitably be used to form the resist underlayer film, and a pattern-forming method that utilizes the resist underlayer film-forming composition. The resist underlayer film-forming composition may suitably be used for production of semiconductor devices and the like of which the processing size is expected to be further reduced in the future.

The resist underlayer film-forming composition, the resist underlayer film, and the pattern-forming method are described in detail below.

Resist Underlayer Film-Forming Composition

A resist underlayer film-forming composition according to one embodiment of the invention is used for a multilayer resist process that includes forming a silicon-based oxide film on a surface of a resist underlayer film, and subjecting the silicon-based oxide film to wet etching, and includes the polymer [A] that has a glass transition temperature (Tg) of 0 to 180° C. The polymer [A] included in the resist underlayer film-forming composition according to one embodiment of the invention is characterized by having a Tg of 0 to 180° C. As a result, a resist underlayer film that is formed using the resist underlayer film-forming composition according to one embodiment of the invention exhibits excellent adhesion to the substrate, and is rarely removed from the substrate. It is conjectured that a residual stress that occurs in the resist underlayer film due to heating is reduced when the resist underlayer film-forming composition according to one embodiment of the invention includes the polymer [A] that has a Tg within the above specific range.

Since the resist underlayer film-forming composition exhibits excellent wet etching resistance, it is possible to suppress a situation in which the pattern of the resist underlayer film collapses due to external stimulation caused by etching even when using the multilayer resist process that performs wet etching after forming a resist film.

Note that the polymer [A] may have two or more glass transition temperatures (Tg). When the polymer [A] has two or more glass transition temperatures (Tg), it suffices that the polymer [A] have at least one glass transition temperature (Tg) within the range of 0 to 180° C. The polymer [A] may have a glass transition temperature (Tg) within the range of less than 0° C., or within the range of more than 180° C.

The resist underlayer film-forming composition preferably includes [B] a polymer having a glass transition temperature (Tg) of more than 180° C. (hereinafter may be referred to as "polymer [B]"), [C] an acid generator, and a solvent. The resist underlayer film-forming composition may further include an additional optional component as long as the advantageous effects of the invention are not impaired. Each component is described in detail below.

Polymer [A]

The polymer [A] is a polymer having a Tg of 0 to 180° C. Examples of the polymer [A] include an olefin-based polymer, a novolac-based polymer, and the like. An acrylate polymer, an acrylamide-based polymer, a vinyl ether-based polymer, a styrene-based polymer, and a cycloolefin-based polymer are preferable as the olefin-based polymer.

The glass transition temperature (Tg) of the polymer [A] included in the resist underlayer film-forming composition is 0 to 180° C., preferably 40 to 160° C., and more preferably 70 to 120° C.

The upper limit of the Tg of the polymer [A] is preferably 175° C. or less, more preferably 170° C. or less, still more preferably 165° C. or less, and particularly preferably 160° C. or less.

The lower limit of the Tg of the polymer [A] is preferably 10° C. or more, more preferably 20° C. or more, still more preferably 30° C. or more, and particularly preferably 40° C. or more.

It is preferable that the polymer [A] include at least one structural unit selected from the group consisting of the structural unit (I) represented by the formula (1), the structural unit (II) represented by the formula (2), the structural unit (III) that includes a —CH$_2$OH group and an aromatic group, and the structural unit (IV) represented by the formula (3). Note that the polymer [A] may include two or more types of the structural unit (I), may include two or more types of the structural unit (II), may include two or more types of the structural unit (III), and may include two or more types of the structural unit (IV). Each structural unit is described in detail below.

Structural Unit (I)

The structural unit (I) is represented by the formula (1). When the polymer [A] includes the structural unit (I), the Tg of the polymer [A] relatively decreases. As a result, a resist underlayer film that is formed using the resist underlayer film-forming composition that includes the polymer [A] exhibits excellent adhesion to the substrate, and also exhibits excellent wet etching resistance.

In the formula (1), $R^1$ is a hydrogen atom, a fluorine atom, or a methyl group, provided that some or all of the hydrogen atoms of the methyl group are substituted with a substituent, or unsubstituted, E is an oxygen atom, —CO—O—*, or —CO—NH—*, * is a bonding site to which $R^2$ is bonded, and $R^2$ is a monovalent hydrocarbon group, provided that some or all of the hydrogen atoms of the hydrocarbon group are substituted with a substituent, or unsubstituted. Note that the structural unit (I) excludes a structural unit that includes both a —CH$_2$OH group and an aromatic group.

Examples of a substituent that may substitute the methyl group represented by $R^1$ include a fluorine atom, a hydroxyl group, an alkoxy group, an acyloxy group, and the like.

The monovalent hydrocarbon group represented by $R^2$ is preferably a monovalent hydrocarbon group having 1 to 20 carbon atoms. Examples of the hydrocarbon group include a monovalent aromatic hydrocarbon group, a monovalent alicyclic hydrocarbon group, a monovalent chain-like hydrocarbon group, a group obtained by combining arbitrary groups among these groups, and the like.

Examples of the monovalent aromatic hydrocarbon group include monovalent aromatic hydrocarbon groups having 6 to 20 carbon atoms, and the like. The monovalent aromatic hydrocarbon group is preferably an aromatic hydrocarbon group having 6 to 12 carbon atoms, such as a phenyl group or a naphthyl group.

Examples of the monovalent alicyclic hydrocarbon group include monovalent alicyclic hydrocarbon groups having 3 to 20 carbon atoms, and the like. The monovalent alicyclic hydrocarbon group is preferably an alicyclic hydrocarbon group having 3 to 12 carbon atoms, such as a cyclopentyl group, a 1-methylcyclopentyl, a 2-ethylcyclopentyl, a cyclohexyl group, a 1-ethylcyclohexyl group, a 2-methylcyclohexyl group, a 1-adamantyl group, a 2-adamantyl group, or a 2-methyl-2-adamantyl group.

Examples of the monovalent chain-like hydrocarbon group include monovalent chain-like hydrocarbon groups having 1 to 20 carbon atoms, and the like. The monovalent chain-like hydrocarbon group is preferably a chain-like hydrocarbon group having 1 to 12 carbon atoms, such as a methyl group, an ethyl group, a propyl group, or a butyl group.

Examples of a substituent that may substitute the monovalent hydrocarbon group represented by $R^2$ include a halogen atom, a hydroxyl group, an alkoxy group, an acyloxy group, a carboxyl group, an alkoxycarbonyl group, a thiol group, a cyano group, an amino group, an amide group, and the like. Note that it is preferable that the monovalent hydrocarbon group represented by $R^2$ not be substituted with a substituent.

Examples of the halogen atom include a fluorine atom, a chlorine atom, a bromine atom, an iodine atom, and the like.

Examples of the alkoxy group include a methoxy group, an ethoxy group, and the like.

Examples of the acyloxy group include a formyloxy group, an acetyloxy group, and the like.

Examples of the alkoxycarbonyl group include a methoxycarbonyl group, an ethoxycarbonyl group, and the like.

Examples of the amide group include an acetamide group, a propionamide group, a butyramide group, a benzamide group, and the like.

The structural unit represented by the formula (1) is preferably a structural unit represented by the following formula (1-1).

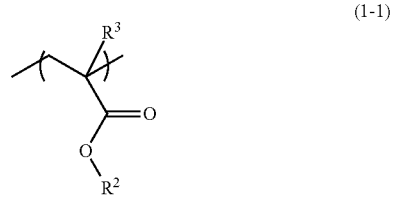

wherein $R^1$ and $R^2$ are the same as defined for the formula (1).

Examples of the structural unit (I) include structural units represented by the following formulas, and the like.

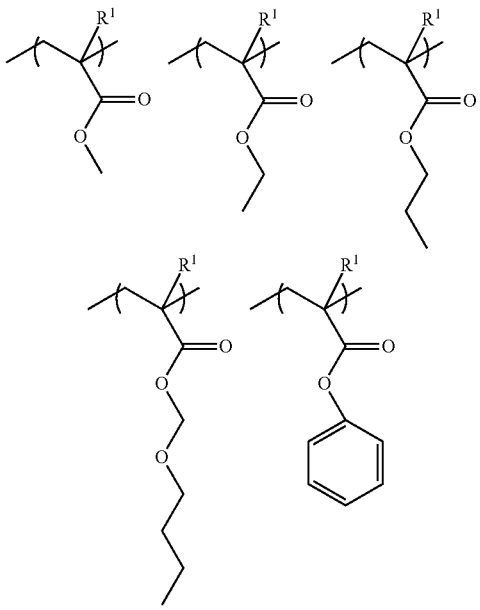

The content of the structural unit (I) in the polymer [A] is preferably 1 to 50 mol %, and more preferably 5 to 40 mol %, based on the total structural units included in the polymer [A]. When the content of the structural unit (I) is within the above range, a resist underlayer film that is formed using the resist underlayer film-forming composition exhibits excellent adhesion to the substrate.

Structural Unit (II)

The structural unit (II) is represented by the formula (2). When the polymer [A] includes the structural unit (II), a resist underlayer film that is formed using the resist underlayer film-forming composition exhibits improved dry etching resistance. For example, when the polymer [A] includes the structural unit (II) together with the structural unit (I), a resist underlayer film that is formed using the resist underlayer film-forming composition that includes the polymer [A] exhibits excellent adhesion to the substrate and excellent dry etching resistance.

In the formula (2), $R^3$ is a hydrogen atom, a fluorine atom, or a methyl group, provided that some or all of the hydrogen atoms of the methyl group are substituted with a substituent, or unsubstituted, $R^4$ is a single bond or a chain-like hydrocarbon group having 1 to 4 carbon atoms, and Ar is a monovalent aromatic hydrocarbon group, provided that some or all of the hydrogen atoms of the aromatic hydrocarbon group are substituted with a substituent, or unsubstituted. Note that the structural unit (II) excludes a structural unit that includes both a —$CH_2OH$ group and an aromatic group.

Examples of the chain-like hydrocarbon group having 1 to 4 carbon atoms represented by $R^4$ include a methylene group, an ethylene group, a propylene group, a butylene group, and the like.

Examples of the monovalent aromatic hydrocarbon group represented by Ar include monovalent aromatic hydrocarbon groups having 6 to 20 carbon atoms, and the like. The monovalent aromatic hydrocarbon group is preferably an aromatic hydrocarbon group having 6 to 14 carbon atoms, such as a phenyl group, a naphthyl group, or an anthryl group.

Examples of a substituent that may substitute the methyl group represented by $R^3$ include a fluorine atom, a hydroxyl group, an alkoxy group, an acyloxy group, and the like.

Examples of a substituent that may substitute the monovalent aromatic hydrocarbon group represented by Ar include a halogen atom, a hydroxyl group, an alkoxy group, an acyloxy group, a carboxyl group, an alkoxycarbonyl group, a thiol group, a cyano group, an amino group, an amide group, and the like. Note that it is preferable that the monovalent aromatic hydrocarbon group represented by Ar not be substituted with a substituent.

Examples of the alkoxy group, the acyloxy group, the alkoxycarbonyl group, and the amide group include those mentioned above in connection with a substituent that may substitute the monovalent hydrocarbon group represented by $R^2$, and the like.

Examples of the structural unit (II) include structural units represented by the following formulas, and the like.

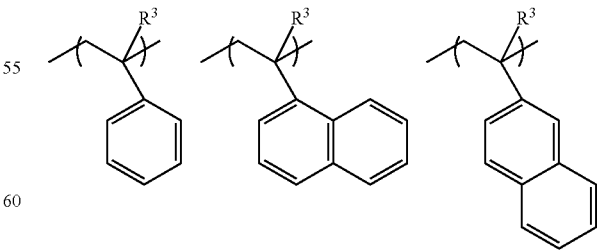

The content of the structural unit (II) in the polymer [A] is preferably 1 to 80 mol %, and more preferably 10 to 70 mol %, based on the total structural units included in the polymer [A]. When the content of the structural unit (II) is within the above range, a resist underlayer film that is formed using the resist underlayer film-forming composition exhibits excellent dry etching resistance.

Structural Unit (III)

The structural unit (III) includes a —CH$_2$OH group and an aromatic group. When the polymer [A] includes the structural unit (III), the polymer [A] exhibits an improved crosslinking capability.

Examples of the structural unit (III) include a structural unit represented by the following formula (4), and the like.

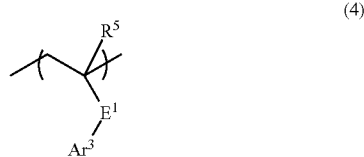

(4)

wherein $R^5$ is a hydrogen atom, a fluorine atom, or a methyl group, provided that some or all of the hydrogen atoms of the methyl group are substituted with a substituent, or unsubstituted, $E^1$ is a single bond, a chain-like hydrocarbon group having 1 to 4 carbon atoms, an oxygen atom, —CO—O—*, or —CO—NH—*, * is a bonding site to which $Ar^3$ is bonded, and $Ar^3$ is a monovalent aromatic hydrocarbon group that includes a —CH$_2$OH group, provided that some or all of the hydrogen atoms of the aromatic hydrocarbon group are substituted with a substituent, or unsubstituted.

Examples of a substituent that may substitute the methyl group represented by $R^5$ include a fluorine atom, a hydroxyl group, an alkoxy group, an acyloxy group, and the like.

Examples of the chain-like hydrocarbon group having 1 to 4 carbon atoms represented by $E^1$ include those mentioned above in connection with the chain-like hydrocarbon group having 1 to 4 carbon atoms represented by $R^4$, and the like.

Examples of the monovalent aromatic hydrocarbon group represented by $Ar^3$ include monovalent aromatic hydrocarbon groups having 6 to 20 carbon atoms, and the like. The monovalent aromatic hydrocarbon group is preferably an aromatic hydrocarbon group having 6 to 14 carbon atoms, such as a phenyl group, a naphthyl group, or an anthryl group.

Examples of a substituent that may substitute the monovalent aromatic hydrocarbon group include a halogen atom, a hydroxyl group, an alkoxy group, an acyloxy group, a carboxyl group, an alkoxycarbonyl group, a thiol group, a cyano group, an amino group, an amide group, and the like.

Examples of the halogen atom, the alkoxy group, the acyloxy group, the alkoxycarbonyl group, and the amide group include those mentioned above in connection with a substituent that may substitute the monovalent hydrocarbon group represented by $R^2$, and the like.

Examples of the structural unit (III) include structural units represented by the following formulas, and the like.

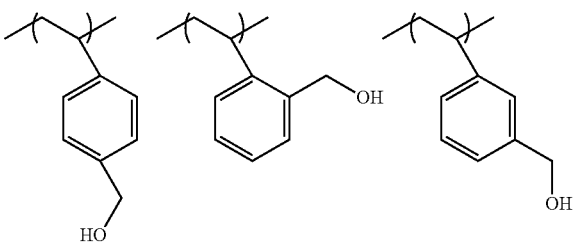

The content of the structural unit (III) in the polymer [A] is preferably 1 to 50 mol %, and more preferably 5 to 40 mol %, based on the total structural units included in the polymer [A]. When the content of the structural unit (III) is within the above range, the polymer [A] exhibits a more appropriate crosslinking capability.

Structural Unit (IV)

The structural unit (IV) is represented by the formula (3). When the polymer [A] includes the structural unit (IV), a resist underlayer film that is formed using the resist underlayer film-forming composition exhibits improved dry etching resistance.

In the formula (3), $Ar^2$ is an aromatic group having a valency of (m11+m12+1), $R^{10}$ is a hydroxyl group, an alkyl group having 1 to 6 carbon atoms, an alkoxy group having 1 to 6 carbon atoms, an alkoxycarbonyl group having 2 to 10 carbon atoms, an aryl group having 6 to 14 carbon atoms, a glycidyl ether group, an alkyl glycidyl ether group wherein an alkyl moiety has 1 to 6 carbon atoms, or —OR (wherein R is a labile functional group), provided that some or all of the hydrogen atoms of the alkyl group, the alkoxy group, the alkoxycarbonyl group, the aryl group, the glycidyl ether group, and the alkyl glycidyl ether group are substituted with a substituent, or unsubstituted, $Z^0$ is a single bond, a methylene group, an alkylene group having 2 to 20 carbon atoms, an arylene group having 6 to 14 carbon atoms, or an alkylene ether group, provided that some or all of the hydrogen atoms of the methylene group, the alkylene group, the arylene group, and the alkylene ether group are substituted with a substituent, or unsubstituted, * is a bonding site, m11 is an integer from 1 to 6 that indicates the number of $Z^0$ bonded to $Ar^2$, and m12 is an integer from 1 to 6 that indicates the number of $R^{10}$ bonded to $Ar^2$, provided that a plurality of $Z^0$ are either identical or different when m11 is an integer from 2 to 6, and a plurality of $R^{10}$ are either identical or different when m12 is an integer from 2 to 6.

Examples of the aromatic group having a valency of (m11+m12+1) represented by $Ar^2$ include groups obtained by removing (m11+m12+1) hydrogen atoms from a benzene-type aromatic ring (e.g., benzene ring, naphthalene ring, anthracene ring, indene ring, and fluoronylidenebiphenyl ring) or a heteroaromatic ring (e.g., furan ring, pyrrole ring, thiophene ring, phosphole ring, pyrazole ring, oxazole ring, isoxazole ring, thiazole ring, pyridine ring, pyrazine ring, pyrimidine ring, pyridazine ring, heteroaromatic ring, and triazine ring), and the like.

Examples of the alkyl group having 1 to 6 carbon atoms represented by $R^{10}$ include a methyl group, an ethyl group, an n-propyl group, an i-propyl group, an n-butyl group, a 2-methylpropyl group, a 1-methylpropyl group, a t-butyl group, and the like.

Examples of the alkoxy group having 1 to 6 carbon atoms represented by $R^{10}$ include a methoxy group, an ethoxy group, an n-propoxy group, an i-propoxy group, an n-butoxy group, a 1-methylpropoxy group, a 2-methylpropoxy group, a t-butoxy group, and the like.

Examples of the alkoxycarbonyl group having 2 to 10 carbon atoms represented by $R^{10}$ include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, and the like.

Examples of the aryl group represented by $R^{10}$ include a phenyl group, a naphthyl group, and the like.

Examples of the alkyl glycidyl ether group represented by $R^{10}$ wherein the alkyl moiety has 1 to 6 carbon atoms include a methyl glycidyl ether group, an ethyl glycidyl ether group, a propyl glycidyl ether group, a butyl glycidyl ether group, and the like.

Examples of the labile functional group represented by R include a group that dissociates in the presence of a base (e.g., in a 2.38 mass % tetramethylammonium hydroxide aqueous solution at 23° C.) (hereinafter may be referred to as "base-labile functional group"), a group that dissociates in the presence of an acid (hereinafter may be referred to as "acid-labile functional group"), a group that dissociates by heating when forming a resist underlayer film (hereinafter may be referred to as "heat-labile functional group"), and the like.

Examples of the base-labile functional group include fluorine-containing alkylcarbonyl groups, a benzyl group, an N-imidemethyl group, and the like.

Examples of the acid-labile functional group include alkoxycarbonyl groups (e.g., t-BuOCO—), alkoxy-substituted methyl groups (e.g., methoxymethyl group), and the like.

Examples of, the heat-labile functional group include alkoxycarbonylmethyl groups (e.g., t-BuOCOCH$_2$—) and the like.

Examples of the alkylene group having 2 to 20 carbon atoms represented by $Z^0$ include an ethylene group, a propylene group (e.g., 1,3-propylene group and 1,2-propylene group), a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

Examples of the arylene group having 6 to 14 carbon atoms represented by $Z^0$ include a phenylene group, a naphthylene group, an anthrylene group, a phenanthrylene group, and the like.

The number of carbon atoms of the alkylene moiety of the alkylene ether group represented by $Z^0$ is preferably 2 to 20. Examples of the alkylene ether group include an ethylene ether group, a propylene ether groups (e.g., 1,3-propylene ether group and 1,2-propylene ether group), a tetramethylene ether group, a pentamethylene ether group, a hexamethylene ether group, and the like.

Examples of the structural unit (IV) include structural units represented by the following formulas (3-1) and (3-2), and the like.

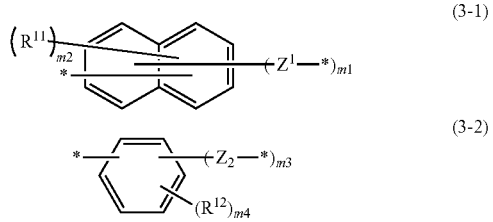

wherein $R^{11}$ and $R^{12}$ are the same as defined for $R^{10}$ in the formula (3), and $Z^1$ and $Z^2$ are the same as defined for $Z^0$ in the formula (3).

m1 is an integer from 1 to 6 that indicates the number of $Z^1$ bonded to the aromatic ring, m2 is an integer from 1 to 6 that indicates the number of $R^{11}$ bonded to the aromatic ring, m3 is an integer from 1 to 4 that indicates the number of $Z^2$ bonded to the aromatic ring, and m4 is an integer from 1 to 4 that indicates the number of $R^{12}$ bonded to the aromatic ring, provided that m1+m2≤7 and m3+m4≤5.

Note that a plurality of $R^{11}$ are either identical or different when a plurality of $R^{11}$ are present, a plurality of $R^{12}$ are either identical or different when a plurality of $R^{12}$ are present, a plurality of $Z^1$ are either identical or different when a plurality of $Z^1$ are present, and a plurality of $Z^2$ are either identical or different when a plurality of $Z^2$ are present. Two or more $Z^1$ are bonded to the aromatic ring when m1 is an integer from 2 to 6, and two or more $Z^2$ are bonded to the aromatic ring when m3 is an integer from 2 to 4. In such a case, the polymer [A] that includes the aromatic ring has a branched structure or a network structure.

Examples of a substituent that may substitute the groups represented by $R^{10}$, $R^{11}$, $R^{12}$, $Z^0$, $Z^1$, and $Z^2$ in the formulas (3), (3-1), and (3-2) include a halogen atom, a hydroxyl group, an aryl group having 6 to 22 carbon atoms, and the like.

Examples of the halogen atom include a fluorine atom, a chlorine atom, a bromine atom, an iodine atom, and the like.

Examples of the aryl group having 6 to 22 carbon atoms include a phenyl group, a naphthyl group, and the like.

Method for Synthesizing Polymer [A]

The polymer [A] may be synthesized by polymerizing a monomer that produces each structural unit in an appropriate solvent using a radical initiator, or condensing a monomer that produces each structural unit and an aldehyde (e.g., paraformaldehyde) in the presence of an acid, for example. The polymer [A] is preferably synthesized by adding a solution containing a monomer and a radical initiator dropwise to a reaction solvent or a solution containing a monomer to effect polymerization, adding a solution containing a monomer and a solution containing a radical initiator dropwise to a reaction solvent or a solution containing a monomer to effect polymerization, or adding a plurality of solutions respectively containing a monomer and a solution containing a radical initiator dropwise to a reaction solvent or a solution containing a monomer to effect polymerization, for example.

The reaction temperature employed for the above synthesis method may be appropriately determined depending on the type of the initiator, but is normally 30 to 180° C., preferably 40 to 160° C., and more preferably 50 to 140° C. The total reaction time including the dropwise addition time may be appropriately determined depending on the reaction temperature, the type of the initiator, the type of each monomer, and the like, but is normally 30 minutes to 12 hours, and preferably 1 to 8 hours.

Examples of the radical initiator used for polymerization include 2,2'-azobisisobutyronitrile, 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis (2-methylpropionitrile), dimethyl 2,2-azobisisobutyrate, and the like. These initiators may be used either alone or in combination.

An arbitrary solvent that is other than a solvent that hinders polymerization (e.g., nitrobenzene having a polymerization inhibiting effect or a mercapto compound having a chain transfer effect) and dissolves the monomers, and a polymer synthesized from the monomers, may be used as the polymerization solvent. Examples of the polymerization solvent include ketone-based solvents, amide-based solvents, ester-lactone-based solvents, nitrile-based solvents, a mixed solvent thereof, and the like. These solvents may be used either alone or in combination.

The polymer obtained by polymerization is preferably collected by reprecipitation. Specifically, the polymer solution is poured into a reprecipitation solvent after completion of polymerization to collect the target polymer as a powder. An alcohol, an alkane, or the like may be used as the reprecipitation solvent either alone or in combination. The polymer may also be collected by removing low-molecular-weight components (e.g., monomer and oligomer) by a separation operation, a column operation, ultrafiltration, or the like.

The polystyrene-reduced weight average molecular weight (Mw) of the polymer [A] determined by gel permeation chromatography (GPC) is not particularly limited, but is preferably 1000 to 50,000, and more preferably 2000 to 40,000. If the Mw of the polymer [A] is less than 1000, the resist underlayer film-forming composition may exhibit a deterioration in film-forming capability when forming a resist underlayer film. If the Mw of the polymer [A] exceeds 50,000, the resulting resist underlayer film may exhibit a deterioration in adhesion.

Note that the term "Mw" used herein refer to a value measured by gel permeation chromatography (GPC) using GPC columns (manufactured by Tosoh Corporation, G2000HXL×2, G2000HXL×2, G3000HXL×1) at a flow rate of 1.0 ml/min and a column temperature of 40° C. (eluant: tetrahydrofuran, standard: monodisperse polystyrene).

Polymer [B]

The polymer [B] is a polymer having a glass transition temperature (Tg) of more than 180° C. The polymer [B] does not have a glass transition temperature (Tg) within the temperature range of 0 to 180° C.

The polymer [B] is not particularly limited as long as the polymer [B] has the above properties. The glass transition temperature (Tg) of the polymer [B] is preferably 200° C. or more, and more preferably 230° C. or more.

Examples of the polymer [B] include aromatic polymers such as a poly(arylene ether)-based polymer, a poly(arylene ketone)-based polymer, a poly(arylene ether ketone)-based polymer, a poly(arylene sulfone)-based polymer, a poly(arylene sulfide)-based polymer, a poly(arylene ether sulfone)-based polymer, a polyimide-based polymer, a polyetherimide-based polymer, a polybenzimidazole-based polymer, a polybenzothiazole-based polymer, a polybenzoxazole-based polymer, an acenaphthylene-based polymer, and a novolac-based polymer, and the like.

When the resist underlayer film-forming composition includes the polymer [B], the polymer [B] is preferably used in an amount of 0.1 to 50 parts by mass based on 100 parts by mass of the polymer [A] and the polymer [B] in total.

Method for Synthesizing Polymer [B]

The polymer [B] may be synthesized by a known method. A commercially available product may be used as the polymer [B].

The Mw of the polymer [B] is not particularly limited, but is preferably 1000 to 200,000, and more preferably 2000 to 100,000. If the Mw of the polymer [B] is less than 1000, the resist underlayer film-forming composition may exhibit a deterioration in film-forming capability when forming a resist underlayer film. If the Mw of the polymer [B] exceeds 200,000, the resulting resist underlayer film may exhibit a deterioration in adhesion.

Acid Generator [C]

It is preferable that the resist underlayer film-forming composition include the acid generator [C]. The acid generator [C] is a component that generates an acid upon exposure or heating. When the resist underlayer film-forming composition includes the acid generator [C], the crosslinking reaction of the polymer [A] can be further promoted. The acid generator [C] may be included in the resist underlayer film-forming composition as a compound (described below), and/or may be included in the polymer.

Examples of the acid generator [C] include onium salt compounds, sulfonimide compounds, and the like. It is preferable to use an onium salt compound as the acid generator [C].

Examples of the onium salt compounds include sulfonium salts (including tetrahydrothiophenium salts), iodonium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylphosphonium 1,1,2,2-tetrafluoro-6-(1-adamantanecarbonyloxy)hexane-1-sulfonate, and the like. Among these, triphenylsulfonium trifluoromethanesulfonate, triphenylsulfonium nonafluoro-n-butanesulfonate, and triphenylphosphonium 1,1,2,2-tetrafluoro-6-(1-adamantanecarbonyloxy)hexane-1-sulfonate are preferable.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyptetrahydrothiophenium nonafluoro-n-butanesulfonate, 1-(3,5-dimethyl-4-hydroxyphenyptetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like. Among these, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(3,5-dimethyl-4-hydroxyphenyl)tetrahydrothiophenium nonafluoro-n-butanesulfonate are preferable.

Examples of the iodonium salts include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like. Among these, bis(4-t-butylphenyl)iodonium nonafluoro-n-butanesulfonate is preferable.

Examples of the sulfonimide compounds include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3- dicarboxylmide, and the like. Among these, N-(trifluoromethanesulfonyloxy)bicyclo[2.2.1]hept-5-ene-2,3-dicarboxylmide is preferable.

These acid generators [C] may be used either alone or in combination. The acid generator [C] is preferably used in an amount of 0.1 to 15 parts by mass, and more preferably 1 to 10 parts by mass, based on 100 parts by mass of the polymer [A].

Solvent

The resist underlayer film-forming composition normally includes a solvent. Examples of the solvent include ketone-based solvents, amide-based solvents, ether-based solvents, ester-based solvents, a mixed solvent thereof, and the like. These solvents may be used either alone or in combination.

Examples of the ether-based solvents include ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, and the like.

Examples of the ketone-based solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylenonane, cyclopentanone, cyclohexanone, cycloheptanone, cyclooctanone, methylcyclohexanone, 2,4-pentanedione, acetonylacetone, diacetone alcohol, acetophenone, and the like.

Examples of the amide-based solvents include N,N'-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like.

Examples of the ester-based solvents include diethyl carbonate, propylene carbonate, methyl acetate, ethyl acetate, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, methyl acetoacetoate, methyl pyruvate, ethyl pyruvate, diethyl oxalate, di-n-butyl oxalate, methyl lactate, ethyl lactate, n-butyl lactate, n-amyl lactate, diethyl malonate, dimethyl phthalate, diethyl phthalate, and the like.

Further examples of the solvent include aromatic hydrocarbon-based solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; halogen-containing solvents such as dichloromethane, chloroform, fluorocarbon, chlorobenzene, and dichlorobenzene; and the like.

Among these, propylene glycol monomethyl ether acetate, propylene glycol monomethyl ether, ethyl 3-ethoxypropionate, methyl 3-methoxypropionate, ethyl lactate, and cyclohexanone are preferable.

Additional Optional Component

The resist underlayer film-forming composition may include an additional optional component such as a crosslinking agent, a surfactant, and a promoter as long as the advantageous effects of the invention are not impaired. Each additional optional component is described in detail below. Each additional optional component may respectively be used either alone or in combination. The content of each additional optional component may be appropriately determined depending on the objective.

Crosslinking Agent

Examples of the crosslinking agent that may be included in the resist underlayer film-forming composition include an epoxy resin that has a fused polycyclic skeleton, an epoxy resin that has a biphenyl skeleton, an epoxy resin that has an oxazolidone ring skeleton, an amine-type epoxy resin, a compound that includes an alkoxymethylated amino group, and the like. The term "fused polycyclic skeleton" used herein refers to a cyclic hydrocarbon skeleton or a heteroatom-containing cyclic compound skeleton that is formed by two or more monocyclic rings that share an arbitrary side thereof. The monocyclic ring may be a ring that includes a saturated bond, or may be a ring that includes an unsaturated bond. The unsaturated bond is selected from a carbon-carbon double bond, a carbon-nitrogen double bond, and a carbon-carbon triple bond. Examples of the fused polycyclic skeleton include a naphthalene skeleton, a fluorene skeleton, a dicyclopentadiene skeleton, an anthracene skeleton, and the like.

Examples of a commercially available product of an epoxy resin that has a naphthalene skeleton include Epiclon (registered trademark) HP4032, HP4032D, HP4700, HP4770 (manufactured by DIC Corporation); NC-7000, NC-7300 (manufactured by Nippon Kayaku Co., Ltd.); ESN-175, ESN-360 (manufactured by NSCC Epoxy Manufacturing Co., Ltd.); and the like.

Examples of a commercially available product of an epoxy resin that has a fluorene skeleton include Oncoat (registered trademark) EX-1010, EX-1011, EX-1012, EX-1020, EX-1030, EX-1040, EX-1050, EX-1051 (manufactured by Nagase & Co., Ltd.); and the like.

Examples of a commercially available product of an epoxy resin that has a dicyclopentadiene skeleton include Epiclon (registered trademark) HP7200, HP7200L, HP7200H (manufactured by DIC Corporation); Tactix 558 (manufactured by Huntsman Advanced Materials); XD-1000-1L, XD-1000-2L, XD-1000-1L, XD-1000-2L (manufactured by Nippon Kayaku Co., Ltd.); and the like.

Examples of a commercially available product of an epoxy resin that has an anthracene skeleton include jER (registered trademark) YX8800 (manufactured by Japan Epoxy Resins Co., Ltd.); and the like.

Examples of a commercially available product of an epoxy resin that has a biphenyl skeleton include jER (registered trademark) YX4000H, YX4000, YL6616, YL6121H, YL6640 (manufactured by Japan Epoxy Resins Co., Ltd.); NC3000 (manufactured by Nippon Kayaku Co., Ltd.); and the like.

Examples of a commercially available product of an epoxy resin that has an oxazolidone ring skeleton include AER4152, XAC4151 (manufactured by Asahi Kasei Epoxy Co., Ltd.); and the like. Note that an epoxy resin that has an oxazolidone ring skeleton may be obtained by the method disclosed in Japanese Patent Application Publication (KOKAI) No. 2003-119253 (i.e., an epoxy resin and an isocyanate compound are reacted in the presence of a catalyst) or the like.

Among these, an epoxy resin that has an oxazolidone ring skeleton and an epoxy resin that has a naphthalene skeleton are preferable since such an epoxy resin has a modulus of elasticity and toughness in a well-balanced manner.

Examples of the amine-type epoxy resin include tetraglycidyldiaminodiphenylmethane, triglycidylaminophenol, triglycidylaminocresol, diglycidylaniline, diglycidyltoluidine, tetraglycidylxylylenediamine, halogen-substituted products, alkyl-substituted products, alkoxy-substituted products, aryl-substituted products, aryloxy-substituted products, and hydrogenated products thereof, and the like.

Examples of a commercially available product of tetraglycidyldiaminodiphenylmethane include Sumiepoxy (registered trademark) ELM434 (manufactured by Sumitomo Chemical Co., Ltd.); YH434L (manufactured by NSCC Epoxy Manufacturing Co., Ltd.); jER (registered trademark) 604 (manufactured by Japan Epoxy Resins Co., Ltd.); Araldite (registered trademark) MY720, MY721 (manufactured by Huntsman Advanced Materials); and the like.

Examples of a commercially available product of triglycidylaminophenol or triglycidylaminocresol include Sumiepoxy (registered trademark) ELM100, ELM120 (manufactured by Sumitomo Chemical Co., Ltd.); Araldite (registered trademark) MY0500, MY0510, MY0600 (manufactured by Huntsman Advanced Materials); jER (registered trademark) 630 (manufactured by Japan Epoxy Resins Co., Ltd.); and the like.

Examples of a commercially available product of diglycidylaniline include GAN (manufactured by Nippon Kayaku Co., Ltd.); and the like.

Examples of a commercially available product of diglycidyl oluidine include GOT (manufactured by Nippon Kayaku Co., Ltd.); and the like.

Examples of a commercially available product of tetraglycidylxylylenediamine and a hydrogenated product thereof include TETRAD (registered trademark)-X, TETRAD (registered trademark)-C (manufactured by Mitsubishi Gas Chemical Company, Inc.); and the like.

Examples of the compound that includes an alkoxymethylated amino group include melamine compounds such as hexamethoxymethylmelamine and hexabutoxymethylmelamine, glycoluril compounds such as tetramethoxymethylglycoluril and tetrabutoxyglycoluril, and the like.

Among these, tetraglycidyldiaminodiphenylmethane, triglycidylaminophenol, diglycidylaniline, diglycidyltoluidine, and tetrabutoxyglycoluril are preferable since these compounds provide the resulting resist underlayer film with high toughness and an improved balance between the modulus of elasticity and the plastic deformability.

Further examples of the crosslinking agent include a phenol novolac-type epoxy resin, a cresol novolac-type epoxy resin, a resorcinol-type epoxy resin, a phenol aralkyl-type epoxy resin, a triphenylmethane-type epoxy resin, a tetraphenylethane-type epoxy resin, and the like.

Examples of a commercially available product of the phenol novolac-type epoxy resin include jER (registered trademark) 152, 154 (manufactured by Japan Epoxy Resins Co., Ltd.); Epiclon (registered trademark) N-740, N-770, N-775 (manufactured by DIC Corporation); and the like.

Examples of a commercially available product of the cresol novolac-type epoxy resin include Epiclon (registered trademark) N-660, N-665, N-670, N-673, N-695 (manufactured by DIC Corporation); EOCN-1020, EOCN-102S, EOCN-104S (manufactured by Nippon Kayaku Co., Ltd.); and the like.

Examples of a commercially available product of the resorcinol-type epoxy resin include Denacol (registered trademark) EX-201 (manufactured by Nagase ChemteX Corporation); and the like.

Examples of a commercially available product of the triphenylmethane-type epoxy resin include Tactix 742 (manufactured by Huntsman Advanced Materials); EPPN-501H, EPPN-502H (manufactured by Nippon Kayaku Co., Ltd.); and the like.

Examples of a commercially available product of the tetraphenylethane-type epoxy resin include jER (registered trademark) 1031S (manufactured by Japan Epoxy Resins Co., Ltd.); and the like.

Surfactant

The surfactant improves applicability, striation, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

Promoter

Examples of the promoter include a one-electron oxidizing agent that causes a sufficient dehydrogenation reaction necessary for oxidative crosslinking, and the like. The term "one-electron oxidizing agent" refers to an oxidizing agent that undergoes a one-electron transfer reaction. For example, ammonium cerium(IV) nitrate undergoes a one-electron transfer reaction in which a cerium(IV) ion is converted into a cerium(III) ion upon acquisition of one electron. A radical oxidizing agent (e.g., halogen) is converted into an anion upon acquisition of one electron. A phenomenon in which the oxidation target substance (e.g., substrate or catalyst) is oxidized due to removal of one electron from the oxidation target substance is referred to as "one-electron oxidation", and a component that receives one electron is referred to as "one-electron oxidizing agent".

Examples of the one-electron oxidizing agent include metal compounds, peroxides, diazo compounds, halogen atoms, halogen acids, and the like.

Examples of the metal compounds include metal compounds that include cerium, lead, silver, manganese, osmium, ruthenium, vanadium, thallium, copper, iron, bismuth, nickel, or the like. Specific examples of the metal compounds include cerium salts such as cerium(IV) ammonium nitrate, cerium (IV) acetate, cerium(IV) nitrate, and cerium (IV) sulfate; lead compounds such as lead tetraacetate and lead(IV) oxide; silver compounds such as silver(I) oxide, silver (II) oxide, and silver carbonate (Fetizon's reagent); manganese compounds such as permanganates, activated manganese dioxide, and manganese(III) salts; osmium compounds such as osmium tetroxide; ruthenium compounds such as ruthenium tetroxide; vanadium compounds such as $VOCl_3$, $VOF_3$, $V_2O_5$, $NH_4VO_3$, and $NaVO_3$; thallium compounds such as thallium (III) acetate, thallium(III) trifluoroacetate, and thallium(III) nitrate; copper compounds such as copper(II) acetate, copper (II) trifluoromethanesulfonate, copper(II) trifluoroborate, copper(II) chloride, and copper(I) acetate; iron compounds such as iron(III) chloride and potassium hexacyanoferrate (III); bismuth compounds such as sodium bismuthate; nickel compounds such as nickel peroxide; and the like.

Examples of the peroxides include peroxyacids such as peracetic acid and m-chloroperbenzoic acid, hydrogen peroxide, hydroxyperoxides such as alkyl hydroxyperoxides (e.g., t-butyl hydroperoxide), diacyl peroxides, peroxyacid esters, peroxyketals, peroxydicarbonates, dialkyl peroxides, peroxyketones, and the like.

Examples of the diazo compounds include 2,2'-azobisisobutyronitrile and the like.

Examples of the halogen or the halogen acids include halogen atoms selected from chlorine, bromine, and iodine, perhalogen acids, halogen acids, halous acids, hypohalous acids, salts thereof, and the like.

Among these, the peroxides and the diazo compounds are preferable, and m-chloroperbenzoic acid, t-butyl hydroperoxide, and 2,2'-azobisisobutyronitrile are more preferable, since a metal residue or the like rarely adheres to the substrate.

Preparation of Resist Underlayer Film-Forming Composition

The resist underlayer film-forming composition may be prepared by mixing the polymer [A], the polymer [B], the acid generator [C], and an additional optional component in the solvent in a given ratio, for example. The solvent is not particularly limited as long as the solvent can dissolve or disperse the polymer [A], the polymer [B], the acid generator [C], and an additional optional component. The resist underlayer film-forming composition is normally prepared by dissolving the components in the solvent, and filtering the solution through a filter having a pore size of about 0.1 µm, for example.

Resist Underlayer Film

A resist underlayer film according to one embodiment of the invention is formed using the resist underlayer film-forming composition. Since the resist underlayer film is formed using the resist underlayer film-forming composition, the resist underlayer film exhibits excellent adhesion to the substrate.

The resist underlayer film preferably has a static contact angle with water of 70° or more, more preferably 73° or more, still more preferably 76° or more, and particularly preferably 79° or more. When the resist underlayer film has a static contact angle with water of 70° or more (i.e., the resist underlayer film exhibits high hydrophobicity), it is possible to reduce external stimulation due to an aqueous solution during wet etching or the like performed after forming the resist film, for example. This makes it possible to further suppress a situation in which the pattern formed by the resist underlayer film collapses. The upper limit of the static contact angle is preferably 89° or less, more preferably 86° or less, and still more preferably 83° or less.

Method for Forming Resist Underlayer Film

The resist underlayer film may be formed by applying the resist underlayer film-forming composition to the surface of the substrate, another underlayer film (antireflective film), or the like to form a film, and curing the film by heating the film, or curing the film by applying ultraviolet rays to the film while heating the film, for example. The resist underlayer film-forming composition may be applied by spin coating, roll coating, dip coating, or the like. The heating temperature is normally 150 to 500° C., and preferably 180 to 350° C. The heating time is normally 30 to 1200 seconds, and preferably 45 to 600 seconds. The thickness of the resist underlayer film is normally 0.05 to 5 µm.

Pattern-Forming Method

A pattern-forming method that utilizes the resist underlayer film-forming composition includes (1) forming a resist underlayer film on a substrate using the resist underlayer film-forming composition (hereinafter referred to as "step (1)"), (2) forming a silicon-based oxide film on the surface of the resist underlayer film (hereinafter referred to as "step (2)"), and (3) subjecting the silicon-based oxide film to wet etching (hereinafter referred to as "step (3)").

Since the pattern-forming method utilizes the resist underlayer film-forming composition, the resist underlayer film exhibits excellent adhesion to the substrate, and it is possible to suppress a situation in which the resist underlayer film is removed from the substrate due to wet etching or the like.

It is preferable that the pattern-forming method include (a) applying a resist composition to the silicon-based oxide film to form a resist pattern (hereinafter referred to as "step (a)"), and (b) sequentially subjecting the silicon-based oxide film and the resist underlayer film to dry etching using the resist pattern as a mask (hereinafter referred to as "step (a)"), the step (a) and the step (b) being performed between the step (2) and the step (3).

A fine pattern can be formed when the pattern-forming method includes the above steps.

It is preferable that the pattern-forming method further include (c) subjecting the substrate to dry etching using the resist underlayer film as a mask after the silicon-based oxide film has been subjected to wet etching (hereinafter referred to as "step (c)"), the step (c) being performed after the step (3).

A finer pattern can be formed when the pattern-forming method includes the above step.

Since the resist underlayer film-forming composition exhibits excellent wet etching resistance, the resist underlayer film-forming composition may suitably be used for the multilayer resist process that includes removing an intermediate film (e.g., silicon-based oxide film) by wet etching. Each step is described in detail below.

Step (1)

In the step (1), the resist underlayer film is formed on the substrate using the resist underlayer film-forming composition. Examples of the substrate include a wafer coated with an insulating film (e.g., silicon oxide, silicon nitride, silicon oxynitride, or polysiloxane) or a low-dielectric-constant insulating film (e.g., Black Diamond (manufactured by AMAT), SiLK (manufactured by Dow Chemical), or LKD5109 (manufactured by JSR Corporation)). A patterned substrate having a trench, a via, and the like may also be used. The resist underlayer film is formed in the step (1) in the same manner as described above in the section "Method for forming resist underlayer film". Therefore, description thereof is omitted.

An additional underlayer film differing from the resist underlayer film obtained using the resist underlayer film-forming composition according to the embodiments of the invention (hereinafter referred to as "additional underlayer film") may be formed on the substrate in advance. The additional underlayer film is a film that is provided with an antireflective function, flatness, high etching resistance to a fluorine-containing gas (e.g., $CF_4$), and the like. A commercially available product such as NFC HM8006 (manufactured by JSR Corporation) or NFC CT08 (manufactured by JSR Corporation) may be used as the additional underlayer film.

Step (2)

In the step (2), the silicon-based oxide film is formed on the surface of the resist underlayer film. Examples of a silicon-based oxide film-forming composition include NFC SOG508 (manufactured by JSR Corporation) and the like. The silicon-based oxide film may be formed by an arbitrary method. For example, the silicon-based oxide film may be formed by spin coating, a coating method, CVD, or the like. The heating temperature is normally 150 to 500° C., and preferably 180 to 350° C. The heating time is normally 30 to 1200 seconds, and preferably 45 to 600 seconds. The thickness of the silicon-based oxide film is normally 0.01 to 0.3 μm, and preferably 0.02 to 0.1 μm.

Step (a)

In the step (a), the resist composition is applied to the silicon-based oxide film to form a resist pattern Examples of the resist composition include a positive-tone or negative-tone chemically-amplified resist composition that includes a photoacid generator, a positive-tone resist composition that includes an alkali-soluble resin and a quinondiazide photosensitizer, a negative-tone resist composition that includes an alkali-soluble resin and a crosslinking agent, and the like. A commercially available resist composition may be used as the resist composition used for the pattern-forming method according to one embodiment of the invention. The resist composition may be applied by spin coating or the like. The amount of the resist composition applied is adjusted so that the resulting resist film has the desired thickness.

The resist film may be formed by volatilizing a solvent (i.e., a solvent included in the resist composition) from the film by prebaking the film formed by applying the resist composition. The prebake temperature is preferably set to be equal to or higher than the glass transition temperature (Tg) of the polymer [A]. The prebake time is normally 30 to 200 seconds, and preferably 45 to 120 seconds. Note that an additional film may be foimed on the surface of the resist film. The thickness of the resist film is normally 0.01 to 0.5 μm, and preferably 0.02 to 0.3 μm.

The resist film is then exposed, heated, and developed to form a resist pattern. Specifically, the resist film is exposed by selectively applying radiation to the resist film via a photomask. Radiation used for exposure is appropriately selected from visible rays, ultraviolet rays, deep ultraviolet rays, X-rays, electron beams, γ-rays, molecular beams, ion beams, and the like depending on the type of acid generator included in the resist composition. It is preferable to use deep ultraviolet rays. It is more preferable to use KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), or extreme ultraviolet rays (wavelength: 13 nm, for example). Liquid immersion lithography may also be employed.

The exposed resist film is subjected to post-exposure bake in order to improve the resolution, the pattern profile, the developability, and the like. The post-exposure bake temperature is appropriately adjusted depending on the type of the resist composition and the like, but is normally about 30 to about 200° C., and preferably 50 to 150° C.

The resist film is then developed to form a resist pattern. A developer used for development may be appropriately selected depending on the type of the resist composition. When the resist composition is a positive-tone chemically-amplified resist composition or a positive-tone resist composition that includes an alkali-soluble resin, an alkaline aqueous solution of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like may be used as the developer. An appropriate amount of a water-soluble organic solvent, an alcohol (e.g., methanol or ethanol), or a surfactant may be added to the alkaline aqueous solution.

When the resist composition is a negative-tone chemically-amplified resist composition or a negative-tone resist composition that includes an alkali-soluble resin, an aqueous solution of an alkali (e.g., inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine) may be used as the developer.

Step (b)

In the step (b), the silicon-based oxide film and the resist underlayer film are sequentially subjected to dry etching using the resist pattern as a mask. The silicon-based oxide film and the resist underlayer film may be subjected to dry etching using a known dry etching system. As a source gas used for dry etching, an oxygen-containing gas (e.g., $O_2$, CO, or $CO_2$), an inert gas (e.g., He, $N_2$, or Ar), a chlorine-based gas (e.g., $Cl_2$ or $BCl_4$), a fluorine-based gas (e.g., $CHF_3$ or $CF_4$), $H_2$, $NH_3$, or the like may be used depending on the elemental composition of the etching target. Note that these gases may be used in combination.

Step (3)

In the step (3), the silicon-based oxide film is subjected to wet etching. The silicon-based oxide film may be subjected to wet etching using a hydrogen fluoride aqueous solution, a hydrofluoric acid-based buffer solution, or the like. Examples of the hydrofluoric acid-based buffer solution include a mixed solution of a hydrogen fluoride aqueous solution and ammonium fluoride (weak alkali).

Step (c)

In the step (c), the substrate is subjected to dry etching using the resist underlayer film as a mask after the silicon-based oxide film has been subjected to wet etching to obtain a substrate on which the desired pattern is formed. The substrate may be subjected to dry etching using a known dry etching system. Examples of a source gas used for dry etching include those mentioned above in connection with the step (b).

The pattern-forming method may further include a step that removes the resist underlayer film that remains on the substrate.

In this case, the resist underlayer film is removed by plasma ashing. The term "plasma ashing" used herein refers to generating plasma of a reactive gas (e.g., oxygen) in a gas phase, and decomposing the resist underlayer film (organic substance) into $CO_x$, $H_2O$, and the like by utilizing the plasma to remove the resist underlayer film.

The plasma ashing conditions are not particularly limited as long as the resist underlayer film can be removed. For example, high-frequency power applied to the susceptor is preferably 100 to 1000 W, and more preferably 100 to 500 W.

The temperature of the susceptor is preferably 20 to 100° C., and more preferably 20 to 60° C. The pressure inside the processing chamber is preferably 1 to 300 mtorr, and more preferably 30 to 100 mtorr.

The gas used for plasma ashing is not particularly limited as long as the resist underlayer film can be removed. It is preferable to use a gas that includes at least one element selected from the group consisting of nitrogen, hydrogen, ammonia, and argon, and it is more preferable to use a mixed gas of nitrogen and hydrogen, a mixed gas of ammonia and argon, or a mixed gas of ammonia, nitrogen, and hydrogen from the viewpoint of suppressing an increase in the relative dielectric constant of the substrate due to plasma ashing.

When using a mixed gas of nitrogen and hydrogen, it is preferable to use hydrogen in a volume ratio of 20, and more preferably 1 to 10, with respect to nitrogen (=100). When using a mixed gas of ammonia and argon, it is preferable to use argon in a volume ratio of 10 or less with respect to ammonia (=100).

EXAMPLES

The invention is further described below by way of examples. Note that the invention is not limited to the following examples.

The Tg of the polymer [A] and the polymer [B] included in the resist underlayer film-forming compositions used for the examples and comparative example was measured using a differential scanning calorimeter ("DSC204 F1" manufactured by NETZSCH). Note that ">200" in Table 1 indicates that the Tg was not observed even when the temperature was increased to 200° C.

Synthesis of Polymer [A]

Synthesis Example 1

A separable flask equipped with a thermometer was charged with 15 parts by mass of n-butyl acrylate that produces the structural unit (I), 50 parts by mass of 2-vinylnaphthalene that produces the structural unit (II), 35 parts by mass of vinylbenzyl alcohol that produces the structural unit (III), 300 parts by mass of methyl ethyl ketone, and 5 parts by mass of dimethyl 2,2-azobisisobutyrate in a nitrogen atmosphere. The mixture was stirred at 80° C. for 6 hours. The reaction solution was then poured into a large quantity of n-heptane, and a polymer that precipitated by this operation was filtered off to obtain a polymer (A-1). The polymer (A-1) had an Mw of 5000 and a Tg of 75° C.

Synthesis Example 2

A separable flask equipped with a thermometer was charged with 15 parts by mass of ethyl acrylate that produces the structural unit (I), 50 parts by mass of 2-vinylnaphthalene that produces the structural unit (II), 35 parts by mass of vinylbenzyl alcohol that produces the structural unit (III), 300 parts by mass of methyl ethyl ketone, and 5 parts by mass of dimethyl 2,2-azobisisobutyrate in a nitrogen atmosphere. The mixture was stirred at 80° C. for 6 hours. The reaction solution was then poured into a large quantity of n-heptane, and a polymer that precipitated by this operation was filtered off to obtain a polymer (A-2). The polymer (A-2) had an Mw of 5000 and a Tg of 78° C.

Synthesis Example 3

A separable flask equipped with a thermometer was charged with 15 parts by mass of methyl acrylate that produces the structural unit (I), 50 parts by mass of 2-vinylnaphthalene that produces the structural unit (II), 35 parts by mass of vinylbenzyl alcohol that produces the structural unit (III), 300 parts by mass of methyl ethyl ketone, and 5 parts by mass of dimethyl 2,2-azobisisobutyrate in a nitrogen atmosphere. The mixture was stirred at 80° C. for 6 hours. The reaction solution was then poured into a large quantity of n-heptane, and a polymer that precipitated by this operation was filtered off to obtain a polymer (A-3). The polymer (A-3) had an Mw of 7000 and a Tg of 80° C.

Synthesis Example 4

A separable flask equipped with a thermometer was charged with 15 parts by mass of n-butyl acrylate that produces the structural unit (I), 50 parts by mass of 2-vinylnaphthalene that produces the structural unit (II), 35 parts by mass of 5-hydroxymethylacenaphthylene that produces the structural unit (III), 300 parts by mass of cyclohexanone, and 5 parts by mass of dimethyl 2,2-azobisisobutyrate in a nitrogen atmosphere. The mixture was stirred at 80° C. for 6 hours. The reaction solution was then poured into a large quantity of n-heptane, and a polymer that precipitated by this operation was filtered off to obtain a polymer (A-4). The polymer (A-4) had an Mw of 20,000 and a Tg of 110° C.

Synthesis Example 5

A separable flask equipped with a thermometer was charged with 100 parts by mass of acenaphthylene, 78 parts by mass of toluene, 52 parts by mass of dioxane, and 3 parts by mass of 2,2-azobisisobutyronitrile in a nitrogen atmosphere. The mixture was stirred at 70° C. for 5 hours to obtain a polymer having a molecular weight of 10,000. After the addition of 5.2 parts by mass of p-toluenesulfonic acid monohydrate and 40 parts of paraformaldehyde, the mixture was heated to 120° C., and stirred for 6 hours. The reaction solution was poured into a large quantity of isopropanol, and a polymer that precipitated by this operation was filtered off to obtain a polymer (CA-1). The polymer (CA-1) had an Mw of 20,000 and a Tg of >200° C.

Synthesis Example 6

A reactor equipped with a condenser, a thermometer, and a stirrer was charged with 100 parts by mass of 2,7-dihydroxynaphthalene, 100 parts by mass of propylene glycol monomethyl ether acetate, and 50 parts by mass of paraformaldehyde. After the addition of 2 parts by mass of oxalic acid, the mixture was heated to 120° C. while dehydrating the mixture, and reacted for 5 hours to obtain a polymer (CA-2) including the structural unit represented by the following formula. The polymer (CA-2) had an Mw of 3000 and a Tg of >200° C.

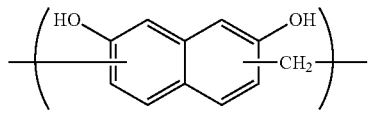

Synthesis Example 7

A reactor equipped with a condenser, a thermometer, and a stirrer was charged with 100 parts by mass of phenol, 100 parts by mass of propylene glycol monomethyl ether acetate, and 50 parts by mass of paraformaldehyde. After the addition of 2 parts by mass of oxalic acid, the mixture was heated to 120° C. while dehydrating the mixture, and reacted for 5 hours to obtain a polymer (A-5) including the structural unit represented by the following formula. The polymer (A-5) had an Mw of 7000 and a Tg of 90° C.

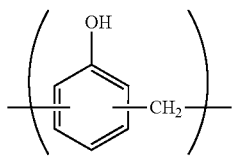

Synthesis of Polymer [B]

A polymer (B-1) that includes the structural unit represented by the following formula (b-1), and a polymer (B-2) that includes the structural unit represented by the following formula (b-2) were synthesized using a known synthesis method. The polymer (B-1) had an Mw of 50,000 and a Tg of >200° C. The polymer (B-2) had an Mw of 5,000 and a Tg of >200° C.

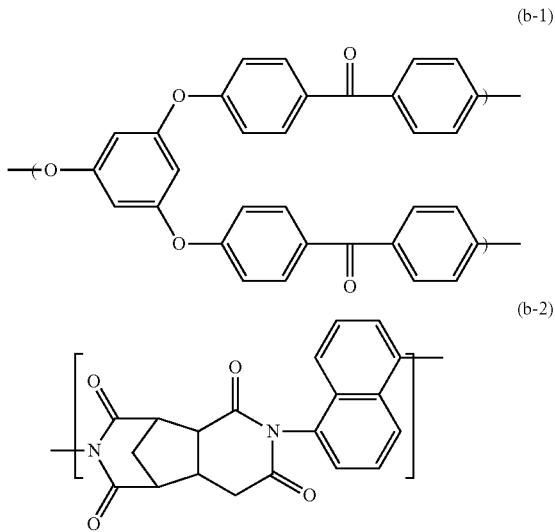

Preparation of Resist Underlayer Film-Forming Composition

Example 1

10 parts by mass of the polymer (A-1) (polymer [A]), 0.3 parts by mass of diphenyliodonium trifluoromethanesulfonate (hereinafter referred to as "C-1") (thermal acid generator) (acid generator [C]), and 1 part by mass of 1,3,4,6-tetrakis(methoxymethyl)glycoluril represented by the following formula (hereinafter referred to as "D-1") (crosslinking agent) were dissolved in 90 parts by mass of propylene glycol monomethyl ether acetate (hereinafter referred to as "E-1") (solvent). The resulting solution was filtered through a membrane filter having a pore size of 0.1 μm to prepare a resist underlayer film-forming composition.

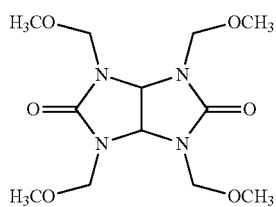 [SMILES: COCN1C(=O)N(COC)C2C1N(COC)C(=O)N2COC]

Examples 2 to 7 and Comparative Examples 1 and 2

A resist underlayer film-forming composition was prepared in the same manner as in Example 1, except that the type and the amount of each component were changed as shown in Table 1. Note that the solvent (E-2) in Table 1 refers to cyclohexanone. The symbol "-" in Table 1 indicates that the corresponding component was not used, or the corresponding property was not observed.

Evaluation

The properties of each resist underlayer film-forming composition prepared as described above were evaluated as described below. The results are shown in Table 1.

Static Contact Angle (°)

The resist underlayer film-forming composition was spin-coated onto an 8-inch silicon wafer, heated at 180° C. for 60 seconds on a hot plate (oxygen concentration: 20 vol %), and then heated at 350° C. for 60 seconds to form a resist underlayer film having a thickness of 0.1 μm. The static contact angle (°) formed by the resist underlayer film and water was measured using a contact angle meter ("DLA10L2E" manufactured by KURRS).

Wet Etching Resistance

The resist underlayer film-forming composition was spin-coated onto an 8-inch silicon wafer, heated at 180° C. for 60 seconds on a hot plate (oxygen concentration: 20 vol %), and then heated at 350° C. for 60 seconds to form a resist underlayer film having a thickness of 0.1 μm. A three-layer resist process silicon-containing intermediate layer-forming composition solution (manufactured by JSR Corporation) (silicon-based oxide film-forming composition) was spin-coated onto the resist underlayer film, heated at 200° C. for 60 seconds, and then heated at 300° C. for 60 seconds on a hot plate to form a silicon-based oxide film having a thickness of 0.045 μm. An ArF resist composition solution (acrylic ArF photoresist manufactured by JSR Corporation) (resist composition) was spin-coated onto the silicon-based oxide film, and prebaked at 130° C. for 90 seconds on a hot plate to form a resist film having a thickness of 0.1 μm. The resist film was exposed via a mask pattern for an optimum exposure time using an ArF excimer laser exposure system (manufactured by Nikon Corporation, numerical aperture: 1.3, exposure wavelength: 193 nm) so that a 40 nm line-and-space pattern was formed. After subjecting the resist film to post-exposure bake at 130° C. for 90 seconds on a hot plate, the resist film was developed at 25° C. for 1 minute using a 2.38% tetramethylammonium hydroxide aqueous solution, rinsed with water, and dried to obtain an ArF positive-tone resist pattern. The silicon-based oxide film and the resist underlayer film were sequentially subjected to dry etching using the resist pattern as a mask utilizing an etching system (manufactured by Tokyo Electron Ltd., etching gas for silicon-based oxide film: $CF_4$ ($CF_4$: 150 mL/min, RF power: 300 W), etching gas for underlayer film: $O_2/N_2$ ($O_2$: 55 mL/min, $N_2$: 65 mL/min, RF power: 700 W)). The silicon-based oxide film was then subjected to wet etching using a 0.1% hydrogen fluoride/ ammonium fluoride buffer aqueous solution. The pattern shape was observed using a scanning electron microscope after wet etching. A case where the pattern of the resist underlayer film was upright was evaluated as "A" ("Acceptable"), a case where only the upper part of the pattern of the resist underlayer film collapsed was evaluated as "B" ("Fair"), and a case where the pattern of the resist underlayer film completely collapsed, or was removed, was evaluated as "C" ("Unacceptable").

applying a resist composition to the silicon-containing oxide film to form a resist pattern, after providing the silicon-containing oxide film and before subjecting the silicon-containing oxide film to wet etching; and sequentially subjecting the silicon-containing oxide film and the resist underlayer film to dry etching using the resist pattern as a mask, after providing the silicon-containing oxide film and before subjecting the silicon-containing oxide film to wet etching.

TABLE 1

| | Component [A] | | Polymer [B] | | Acid generator [C] | | Crosslinking agent | | Solvent | | Tg (° C.) of component [A] | Tg (° C.) of polymer [B] | Static contact angle (°) | Wet etching resistance |
|---|---|---|---|---|---|---|---|---|---|---|---|---|---|---|
| | Type | Parts by mass | Type | Parts by mass | Type | Parts by mass | Type | Parts by mass | Type | Parts by mass | | | | |
| Example 1 | A-1 | 10 | — | — | C-1 | 0.3 | D-1 | 1 | E-1 | 90 | 75 | — | 80 | A |
| Example 2 | A-2 | 10 | — | — | C-1 | 0.3 | D-1 | 1 | E-1 | 90 | 78 | — | 78 | A |
| Example 3 | A-3 | 10 | — | — | C-1 | 0.3 | D-1 | 1 | E-1 | 90 | 80 | — | 78 | A |
| Example 4 | A-4 | 10 | — | — | C-1 | 0.3 | D-1 | 1 | E-1 | 90 | 110 | — | 80 | A |
| Example 5 | A-5 | 10 | — | — | — | — | — | — | E-1 | 90 | 90 | — | 50 | B |
| Example 6 | A-1 | 8 | B-1 | 2 | C-1 | 0.3 | D-1 | 1 | E-2 | 90 | 75 | >200 | 78 | A |
| Example 7 | A-1 | 8 | B-2 | 2 | C-1 | 0.3 | D-1 | 1 | E-2 | 90 | 75 | >200 | 75 | A |
| Comparative Example 1 | CA-1 | 10 | — | — | C-1 | 0.3 | D-1 | 1 | E-2 | 90 | >200 | — | 80 | C |
| Comparative Example 2 | CA-2 | 10 | — | — | — | — | — | — | E-1 | 90 | >200 | — | 45 | C |

As is clear from the results shown in Table 1, it was confirmed that the resist underlayer film-forming composition can form a pattern that exhibits excellent wet etching resistance.

The embodiments of the invention thus provide a resist underlayer film that exhibits excellent adhesion to a substrate and excellent wet etching resistance, and may suitably be used for the multilayer resist process that includes removing an intermediate film (e.g., inorganic film) by wet etching, a resist underlayer film-forming composition that may suitably be used to form the resist underlayer film, and a pattern-forming method that utilizes the resist underlayer film-forming composition. The resist underlayer film-forming composition may suitably be used for production of semiconductor devices and the like of which the processing size is expected to be further reduced in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
providing a resist underlayer film on a substrate using a resist underlayer film-forming composition, the resist underlayer film-forming composition comprising a polymer having a glass transition temperature (Tg) of 0 to 180° C.;
providing a silicon-containing oxide film on a surface of the resist underlayer film;
subjecting the silicon-containing oxide film to wet etching; and
subjecting the substrate to dry etching using the resist underlayer film as a mask, after the silicon-containing oxide film is subjected to wet etching.

2. The pattern-forming method according to claim 1, further comprising:

3. The pattern-forming method according to claim 1, wherein the resist underlayer film has a static contact angle with water of 70° or more.

4. The pattern-forming method according to claim 1, wherein the polymer comprises a first structural unit represented by formula (1),

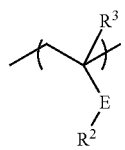

(1)

wherein
$R^1$ is a hydrogen atom, a fluorine atom, or a methyl group, wherein some or all of the hydrogen atoms of the methyl group represented by $R^1$ are substituted with a substituent, or unsubstituted,
E is an oxygen atom, —CO—O—*, or —CO—NH—*, wherein * is a bonding site to which $R^2$ is bonded, and
$R^2$ is a monovalent hydrocarbon group, wherein some or all of the hydrogen atoms of the hydrocarbon group represented by $R^2$ are substituted with a substituent, or unsubstituted.

5. The pattern-forming method according to claim 1, wherein the polymer comprises a second structural unit represented by formula (2),

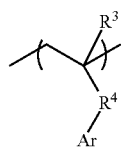

(2)

wherein
$R^3$ is a hydrogen atom, a fluorine atom, or a methyl group, wherein some or all of the hydrogen atoms of the methyl group represented $R^3$ are substituted with a substituent, or unsubstituted, $R^4$ is a single bond or a chain hydrocarbon group having 1 to 4 carbon atoms, and Ar is a monovalent aromatic hydrocarbon group, wherein some or all of the hydrogen atoms of the aromatic hydrocarbon group represented by Ar are substituted with a substituent, or unsubstituted.

6. The pattern-forming method according to claim 1, wherein the polymer comprises a third structural unit, the third structural unit including a —$CH_2OH$ group and an aromatic group.

7. The pattern-forming method according to claim 1, wherein the polymer comprises a fourth structural unit represented by formula (3),

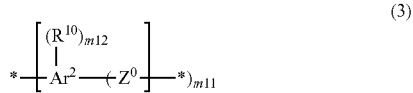

wherein $Ar^2$ is an aromatic group having a valency of (m11+m12+1), $R^{10}$ is a hydroxyl group, an alkyl group having 1 to 6 carbon atoms, an alkoxy group having 1 to 6 carbon atoms, an alkoxycarbonyl group having 2 to 10 carbon atoms, an aryl group having 6 to 14 carbon atoms, a glycidyl ether group, an alkyl glycidyl ether group in which an alkyl moiety has 1 to 6 carbon atoms, or —OR in which R is a labile functional group, wherein some or all of the hydrogen atoms of the alkyl group, the alkoxy group, the alkoxycarbonyl group, the aryl group, the glycidyl ether group, and the alkyl glycidyl ether group represented by $R^{10}$ are substituted with a substituent, or unsubstituted, $Z^0$ is a single bond, a methylene group, an alkylene group having 2 to 20 carbon atoms, an arylene group having 6 to 14 carbon atoms, or an alkylene ether group, wherein some or all of the hydrogen atoms of the methylene group, the alkylene group, the arylene group, and the alkylene ether group represented by $Z^0$ are substituted with a substituent, or unsubstituted,

* is a bonding site, m11 is an integer from 1 to 6 that indicates the number of $Z^0$ bonded to $Ar^2$, and m12 is an integer from 1 to 6 that indicates the number of $R^{10}$ bonded to $Ar^2$, wherein a plurality of $Z^0$ are each either identical or different in a case where m11 is an integer from 2 to 6, and a plurality of $R^{10}$ are each either identical or different in a case where m12 is an integer from 2 to 6.

8. The pattern-forming method according to claim 4, wherein the polymer further comprises a second structural unit represented by formula (2),

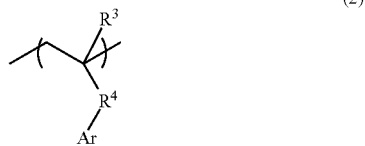

wherein $R^3$ is a hydrogen atom, a fluorine atom, or a methyl group, wherein some or all of the hydrogen atoms of the methyl group represented $R^3$ are substituted with a substituent, or unsubstituted, $R^4$ is a single bond or a chain hydrocarbon group having 1 to 4 carbon atoms, and Ar is a monovalent aromatic hydrocarbon group, wherein some or all of the hydrogen atoms of the aromatic hydrocarbon group represented by Ar are substituted with a substituent, or unsubstituted.

9. The pattern-forming method according to claim 4, wherein the polymer further comprises a third structural unit, the third structural unit including a —$CH_2OH$ group and an aromatic group.

10. The pattern-forming method according to claim 5, wherein the polymer further comprises a third structural unit, the third structural unit including a —$CH_2OH$ group and an aromatic group.

11. The pattern-forming method according to claim 8, wherein the polymer further comprises a third structural unit, the third structural unit including a —$CH_2OH$ group and an aromatic group.

12. The pattern-forming method according to claim 1, wherein the polymer has the glass transition temperature (Tg) of 160° C. or less.

13. The pattern-forming method according to claim 1, wherein the polymer has the glass transition temperature (Tg) of 40° C. or more.

14. The pattern-forming method according to claim 4, wherein a content of the first structural unit in the polymer is 1 to 50 mol %.

15. The pattern-forming method according to claim 5, wherein a content of the second structural unit in the polymer is 1 to 80 mol %.

16. The pattern-forming method according to claim 6, wherein a content of the third structural unit in the polymer is 1 to 50 mol %.

* * * * *